(12) United States Patent
Nandakumar et al.

(10) Patent No.: US 7,557,022 B2
(45) Date of Patent: Jul. 7, 2009

(54) IMPLANTATION OF CARBON AND/OR FLUORINE IN NMOS FABRICATION

(75) Inventors: Mahalingam Nandakumar, Richardson, TX (US); Amitabh Jain, Allen, TX (US); Lahir Shaik Adam, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 215 days.

(21) Appl. No.: 11/451,919

(22) Filed: Jun. 13, 2006

(65) Prior Publication Data

US 2007/0287274 A1     Dec. 13, 2007

(51) Int. Cl.
    *H01L 21/425* (2006.01)
(52) U.S. Cl. .................. 438/527; 438/514; 438/305; 257/E21.443
(58) Field of Classification Search .............. 438/514, 438/527, 305; 257/E21.443
    See application file for complete search history.

(56) References Cited

U.S. PATENT DOCUMENTS

| 6,258,644 | B1  |   | 7/2001  | Rodder et al. |         |
|-----------|-----|---|---------|---------------|---------|
| 2002/0151145 | A1 | * | 10/2002 | Lee et al.   | 438/303 |
| 2007/0029608 | A1 | * | 2/2007  | Huang         | 257/327 |
| 2007/0059874 | A1 | * | 3/2007  | Moumen et al. | 438/199 |
| 2007/0238234 | A1 | * | 10/2007 | Wang et al.   | 438/197 |

* cited by examiner

*Primary Examiner*—Bradley K Smith
(74) *Attorney, Agent, or Firm*—Warren L. Franz; Wade J. Brady, III; Frederick J. Telecky, Jr.

(57) ABSTRACT

Formation of an NMOS transistor is disclosed, where at least one of carbon, atomic fluorine and molecular fluorine ($F_2$) are combined with implantations of at least one of arsenic, phosphorous and antimony. The dopant combinations can be used in LDD implantations to form source/drain extension regions, as well as in implantations to form halo regions and/or source/drain regions. The combinations of dopants help to reduce sheet resistance and increase carrier mobility, which in turn facilitates device scaling and desired device performance.

18 Claims, 3 Drawing Sheets

IMPLANTATION OF CARBON AND/OR FLUORINE IN NMOS FABRICATION

FIELD OF INVENTION

The present invention relates generally to semiconductor processing, and more particularly to adding carbon and/or fluorine to implantation processes performed in semiconductor fabrication, and in particular to LDD (lightly doped drain) implantation processes.

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers. As such, smaller feature sizes, smaller separations between features, and more precise feature shapes are required in integrated circuits (ICs) fabricated on the wafers. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer. Techniques that facilitate device scaling and/or increased packing densities are thus desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

Carbon and/or fluorine are added to implantation processes performed in semiconductor fabrication. More particularly, at least one of carbon, atomic fluorine and molecular fluorine ($F_2$) are included with at least one of arsenic, phosphorous and antimony in NMOS LDD implantations. These combinations may also be included when source and drain regions are formed as well as when halo regions are formed. The addition of the carbon and/or fluorine mitigates dopant diffusion and allows more desirable activation levels to be achieved in the NMOS transistor.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

An exemplary methodology 100 for forming an NMOS transistor is illustrated in FIG. 1, and FIGS. 2-7 are cross-sectional views of a semiconductor substrate 200 wherein such a method is implemented. While the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology disclosed herein. Further, one or more of the acts depicted herein may be carried out in one or more separate acts and/or phases.

Figure 1:
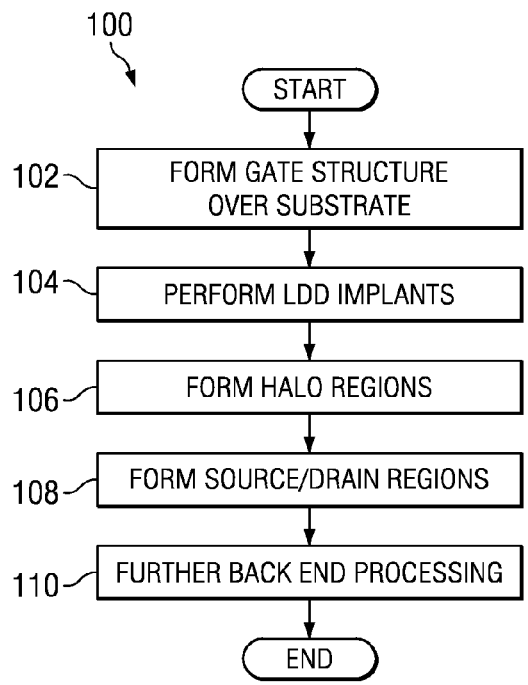
FIG. 1 is a flow diagram illustrating an exemplary methodology for forming an NMOS transistor.
Figure 2:
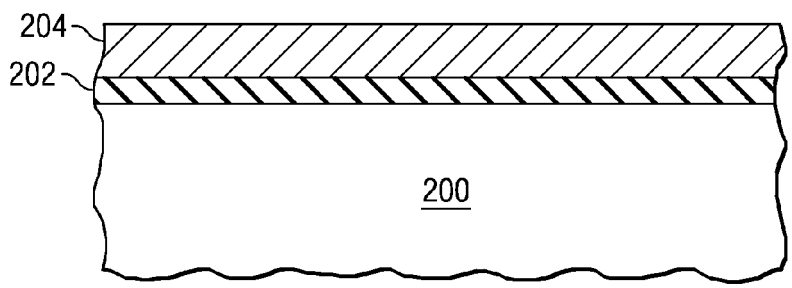
FIGS. 2-7 are cross-sectional views of a semiconductor substrate wherein an NMOS transistor is formed.
Figure 3:
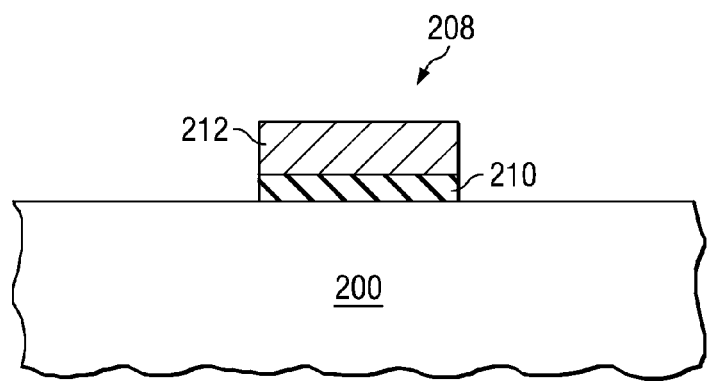

The methodology 100 begins at 102 wherein a gate structure is formed over a semiconductor substrate 200. In particular, a layer of gate dielectric material 202 is formed over the semiconductor substrate 200 and a gate electrode layer 204 is formed over the layer of gate dielectric material 202 (FIG. 2). The gate electrode layer 204 and the layer of gate dielectric material 202 are patterned to form the gate structure 208 (FIG. 3). The gate structure 208 thus comprises a gate electrode 212 and a gate dielectric 210. It will be appreciated that the layers can be patterned in any suitable manner to form the gate structure, such as by etching, for example. It will be appreciated that the gate electrode layer 204 thus yields a contact area or surface that provides a means for applying a voltage to the transistor otherwise biasing the transistor.

Further, the layer of gate dielectric material 202 and the gate electrode layer 204 can be applied to the substrate 200 in any number of ways, such as with spin-on techniques, sputtering techniques (e.g., magnetron or ion beam sputtering), growth and/or deposition techniques such as chemical vapor deposition (CVD), for example. The gate dielectric material 202 can be formed to a thickness of about 1 nanometer or more, and can have an equivalent oxide thickness (EOT) of about 1 nanometer or less, for example, while the gate electrode layer 204 can be formed to a thickness of about 50-200 nm, for example.

Additionally, the gate electrode layer 204 generally includes doped polysilicon, SiGe or metal, and the layer of gate dielectric material 202 can comprise a high-k dielectric material, for example. A dielectric material having a k of about 7.8 and a thickness of about 10 nm, for example, is substantially electrically equivalent to an oxide gate dielectric having a k of about 3.9 and a thickness of about 5 nm. The layer of gate dielectric material 202 may include, for example, any one or more of the following, either alone or in combination: aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

Also, it will be appreciated that substrate as referred to herein may comprise any type of semiconductor body (e.g., silicon, SiGe, SOI) such as a semiconductor wafer or one or more die on a wafer, as well as any other type of semiconductor and/or epitaxial layers grown thereon and/or otherwise associated therewith. It will also be appreciated that the patterning of the gate electrode layer 204 and the layer of gate dielectric material 202 (as with all masking and/or patterning mentioned herein) can be performed in any suitable manner, such as with lithographic techniques, for example, where lithography broadly refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

Figure 4:
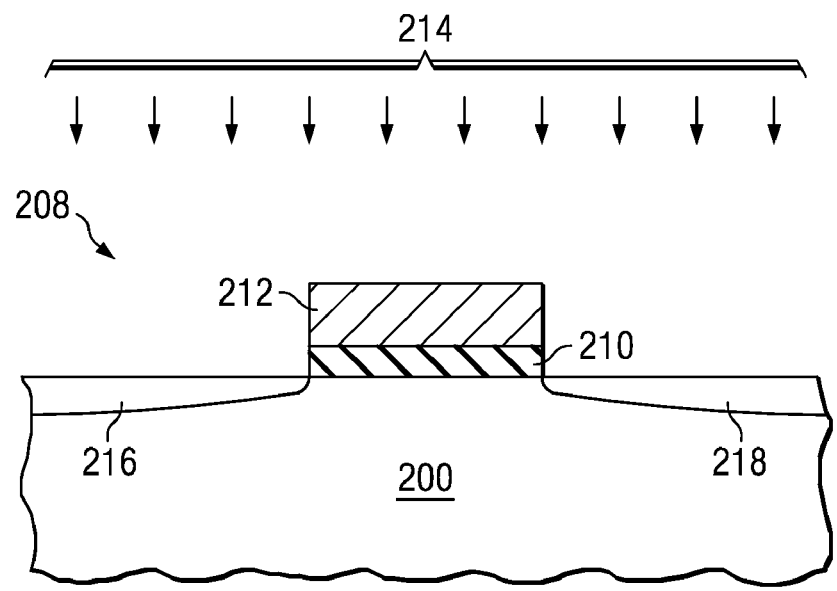

After the gate structure 208 is formed, the methodology proceeds to 104 wherein an LDD implantation 214 is performed to form source/drain extension regions 216, 218 (FIG. 4). The source/drain extension regions 216, 218 are formed by implanting at least one of arsenic, phosphorous and antimony with at least one of carbon, atomic fluorine and molecular fluorine ($F_2$). The gate structure blocks the implanted dopants so that the source/drain extension regions 216, 218 are formed in the substrate 200 on either side of the gate structure 208.

To form the source/drain extension regions 216, 218, the arsenic, phosphorous and/or antimony may be implanted at respective doses of between about $5 \times 10^{13}/cm^2$ and about $1.5 \times 10^{15}/cm^2$, for example, while the carbon, atomic fluorine and/or molecular fluorine ($F_2$) may be implanted at respective doses of between about $1 \times 10^{14}/cm^2$ and about $3 \times 10^{15}/cm^2$, for example. It will be appreciated that the different dopant species are implanted separately, however. The carbon may, for example, be implanted at an energy of between about 3 keV and about 20 keV, the atomic fluorine may be implanted at an energy of between about 2 keV and about 10 keV, and the molecular fluorine may be implanted at an energy of between about 4 keV and about 20 keV, for example. Similarly, the arsenic may, for example, be implanted at an energy of between about 1 keV and about 4 keV, the phosphorous may be implanted at an energy of between about 1 keV and about 8 keV, and the antimony may be implanted at an energy of between about 5 keV and about 40 keV, for example. At these energies, the dopants are implanted such that the source/drain extension regions 216, 218 are formed to a depth of between about 100 Angstroms and 450 Angstroms, for example.

Figure 5:
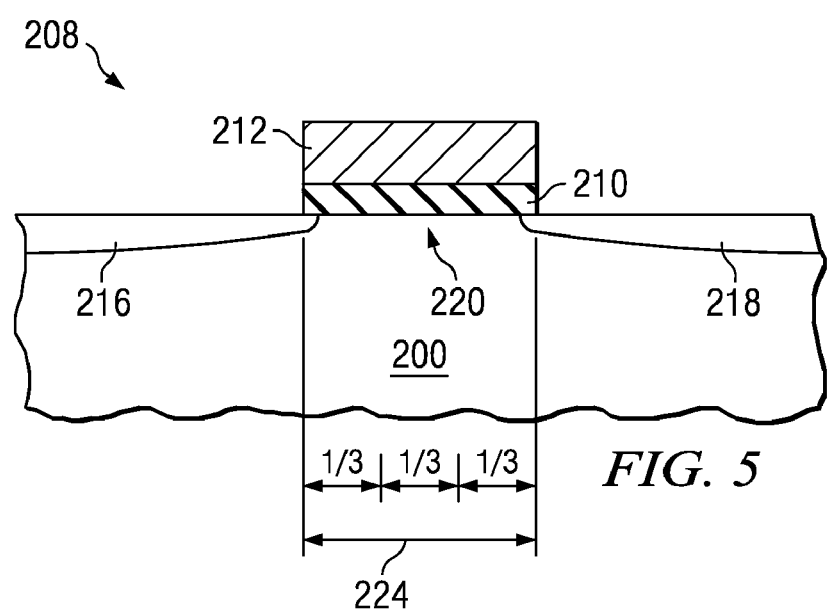

Additionally, the source/drain extension regions 216, 218 may be formed after thin sidewall spacers (not shown) are formed on either side of the gate structure 208. Also, after the source/drain extension regions 216, 218 are implanted, they may be subjected to a heat treatment so that the dopants migrate laterally into a channel region 220 located under the gate structure 208 (FIG. 5). By way of example, if the channel region 220 has a length 224, the source/drain extension regions 216, 218 may extend under about ⅓ of the channel length 224 or less on either side of the gate structure 208. Further, the LDD implantations 214 can be angled with one or more rotations and/or twists relative to a mechanical surface of the substrate and/or to a lattice structure of the substrate 200 to achieve desired doping, such as to implant dopants under at least a portion of an existing structure (e.g., the gate structure 208) on the substrate 200, for example.

Figure 6:
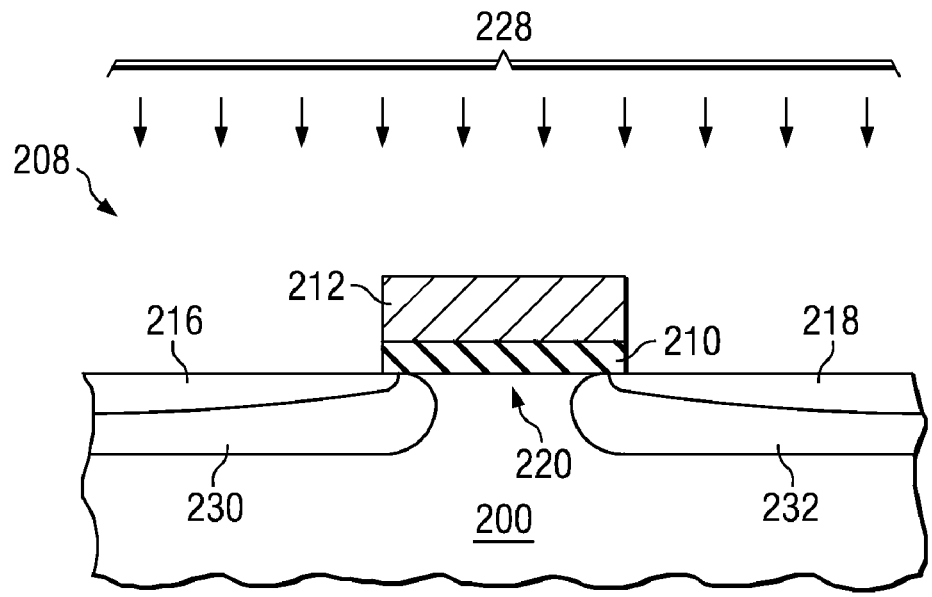

The method then 100 then advances to 106 where halo regions (or pocket implants) are formed (FIG. 6). It will be appreciated, however, that such halo regions can be formed before the LDD implants are performed. One or more quad high-angle implants 228 may be utilized, for example, to selectively locate dopants within the substrate 200 to form the halo regions 230, 232. Similar to the LDD implants 214, the halo regions 230, 232 are formed by implanting at least one of arsenic, phosphorous and antimony with at least one of boron, indium and/or boron di-fluoride ($BF_2$). In addition to using angled implants, dopant atoms are selectively directed into the substrate 200 by virtue of the gate structure 208 and optional sidewall spacers (not shown) formed on the sides of the gate structure 208 which block some dopant atoms.

To form the halo regions 230, 232, the arsenic, phosphorous and/or antimony may be implanted at respective doses of between about $5 \times 10^{14}/cm^3$ and about $1.5 \times 10^{15}/cm^3$, for example, while the boron, indium and/or boron di-fluoride ($BF_2$) may be implanted at respective doses of between about $5 \times 10^{12}/cm^3$ and about $5 \times 10^{14}/cm^3$, for example, where the different dopant species are implanted separately. The boron may, for example, be implanted at an energy of between about 5 keV and about 20 keV, the indium may be implanted at an energy of between about 20 keV and about 100 keV, and the boron di-fluoride may be implanted at an energy of between about 20 keV and about 100 keV, for example. Similarly, the arsenic may, for example, be implanted at an energy of between about 1 keV and about 4 keV, the phosphorous may be implanted at an energy of between about 1 keV and about 8 keV, and the antimony may be implanted at an energy of between about 5 keV and about 40 keV, for example. At these energies, the dopants are implanted such that the halo regions 230, 232 are formed to a depth of between about 100 Angstroms and about 600 Angstroms, for example. The halo regions 230, 232 may also be subjected to a heat treatment so that the dopants migrate laterally into the channel region 220.

Figure 7:
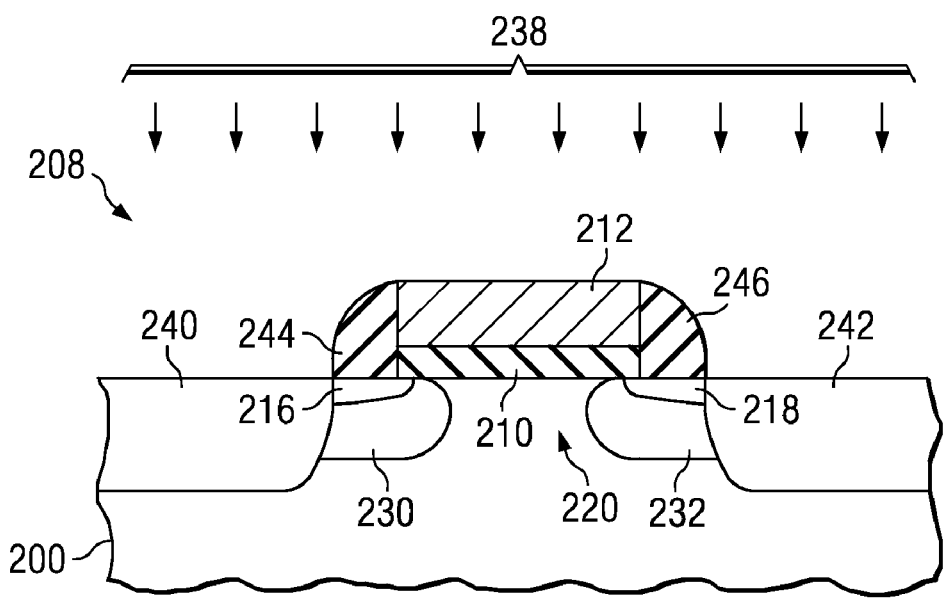

Then, at 108, source and drain implants 238 are performed to form source/drain regions 240, 242 in the substrate 200 (FIG. 7). Sidewall spacers 244, 246 are formed on either side of the gate structure 208 to direct dopant atoms into select locations within the substrate 200, such that the source/drain regions 240, 242 are distanced from the gate structure 208 further than the source/drain extension regions 216, 218. The sidewall spacers generally comprise a non-conductive material such as oxide and/or nitride based materials, for example. Similar to the previous implants, the source/drain regions 240, 242 are formed by implanting at least one of arsenic, phosphorous and antimony with at least one of carbon, atomic fluorine and/or molecular fluorine ($F_2$). It will be appreciated, however, that source and drain implants may be performed either before or after the spacer formation.

To form the source/drain regions 240, 242, the arsenic, phosphorous and/or antimony may be implanted at respective doses of between about $5 \times 10^{14}/cm^2$ and about $1 \times 10^{16}/cm^2$, for example, while the carbon, atomic fluorine and/or molecular fluorine ($F_2$) may be implanted at respective doses of between about $1 \times 10^{14}/cm^2$ and about $3 \times 10^{15}/cm^2$, for example, where the different dopant species are implanted separately. The carbon may, for example, be implanted at an energy of between about 3 keV and about 20 keV, the atomic fluorine may be implanted at an energy of between about 2 keV and about 10 keV, and the molecular fluorine may be implanted at an energy of between about 4 keV and about 20 keV, for example. Similarly, the arsenic may, for example, be implanted at an energy of between about 15 keV and about 40 keV, the phosphorous may be implanted at an energy of between about 1 keV and about 10 keV, and the antimony may be implanted at an energy of between about 10 keV and about 60 keV, for example. At these energies, the dopants are implanted such that the source/drain regions 240, 242 are formed to a depth of between about 100 Angstroms and about 1200 Angstroms, for example. Once the source/drain regions 240, 242 are formed, the methodology 100 advances to 110, and ends thereafter, wherein further back end processing can be performed at 110, such as the formation and/or patterning of one or more additional conductive and/or non-conductive layers.

It will be appreciated that adding at least one of carbon, atomic fluorine and/or molecular fluorine ($F_2$) to implants of at least one of arsenic, phosphorous and antimony as described herein produces more desirable devices by facilitating device scaling and enhancing device performance. For example, as channel length 224 decreases (e.g., due to device scaling) carrier mobility needs to be increased and/or source/drain resistance (Rsd) needs to be reduced. However, Rsd is limited by sheet resistance (Rsh) in one respect and junction depth (xj) in another respect such that there is a tradeoff between Rsh and xj. In particular, as the channel length 224 is decreased, the junction depth (xj) or depth to which dopants can be implanted is reduced where these shallower implants simultaneously cause an increase in sheet resistance (Rsh) because they effectively act as a thinner resistor. Essentially, adding more dopants to a shallower area does not cause sheet resistance to go down. This is because another limitation, known as active concentration, is reached where no matter how much dopant is implanted, only a certain level of electrical activation can be attained. Beyond a certain (saturation) point there is a limit to how many dopant atoms can be electrically activated—which limits sheet resistance.

Adding at least one of carbon, atomic fluorine and/or molecular fluorine ($F_2$) to implants of at least one of arsenic, phosphorous and antimony as described herein helps to reduce sheet resistance and increase carrier mobility because of, among other things, bonding that occurs between the carbon and/or fluorine and interstitials and/or vacancies in the substrate that are generated during the implantation processes. As such, the carbon and/or fluorine help to retard diffusion of phosphorous, arsenic and/or antimony while also helping to improve activation of the phosphorous, arsenic and/or antimony.

It will be appreciated that while reference is made throughout this document to exemplary structures in discussing aspects of methodologies described herein (e.g., those structures presented in FIGS. 2-7 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the drawings.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

What is claimed is:

1. A method of forming an NMOS transistor comprising:
performing an LDD implantation to establish source/drain extension regions in a substrate on either side of a gate structure formed on the substrate, where the LDD implantation comprises:
implanting at least one of arsenic, phosphorous and antimony; and
implanting at least one of carbon, atomic fluorine and molecular fluorine ($F_2$);
forming source/drain regions in the substrate on ether side of the gate structure, the source/drain regions being distanced from the gate structure further than the source/drain extension regions; and forming halo regions in the substrate on ether side of the gate structure, the source/drain regions being distanced from the gate structure further than the halo regions, forming the halo regions comprising:
implanting at least one of arsenic, phosphorous and antimony; and
implanting at least one of boron, indium and/or boron di-fluoride ($BF_2$).

2. The method of claim 1, wherein the at least one of carbon, atomic fluorine and molecular fluorine ($F_2$) are implanted at respective doses of between about $1 \times 10^{14}/cm^2$ and about $3 \times 10^{15}/cm^2$.

3. The method of claim 2, wherein at least one of:
the carbon is implanted at an energy of between about 3 keV and about 20 keV,
the atomic fluorine is implanted at an energy of between about 2 keV and about 10 keV, and
the molecular fluorine is implanted at an energy of between about 4 keV and about 20 keV.

4. The method of claim 3, wherein the at least one of arsenic, phosphorous and antimony are implanted at respective doses of between about $5 \times 10^{13}/cm^2$ and about $1.5 \times 10^{15}/cm^2$.

5. The method of claim 4, wherein at least one of:
the arsenic is implanted at an energy of between about 1 keV and about 4 keV,
the phosphorous is implanted at an energy of between about 1 keV and about 8 keV, and
the antimony is implanted at an energy of between about 5 keV and about 20 keV.

6. The method of claim 5, wherein forming source/drain regions, comprises:

implanting at least one of arsenic, phosphorous and antimony; and implanting at least one of carbon, atomic fluorine and molecular fluorine ($F_2$).

7. The method of claim 1, wherein the at least one of carbon, atomic fluorine and molecular fluorine ($F_2$) are implanted at respective doses of between about $1 \times 10^{14}/cm^2$ and about $3 \times 10^{15}/cm^2$ to form the source/drain regions.

8. The method of claim 7, wherein at least one of:
the carbon is implanted at an energy of between about 3 keV and about 20 keV,
the atomic fluorine is implanted at an energy of between about 2 keV and about 10 keV, and
the molecular fluorine is implanted at an energy of between about 4 keV and about 20 keV to form the source/drain regions.

9. The method of claim 8, wherein the at least one of arsenic, phosphorous and antimony are implanted at respective doses of between about $5 \times 10^{14}/cm^2$ and about $1 \times 10^{16}/cm^2$ to form the source/drain regions.

10. The method of claim 9, wherein at least one of:
the arsenic is implanted at an energy of between about 15 keV and about 40 keV,
the phosphorous is implanted at an energy of between about 1 keV and about 10 keV, and
the antimony is implanted at an energy of between about 10 keV and about 60 keV to form the source/drain regions.

11. The method of claim 1, wherein the at least one of boron, indium and/or boron di-fluoride ($BF_2$) are implanted at respective doses of between about $5 \times 10^{12}/cm^2$ and about $5 \times 10^{14}/cm^2$ to form the halo regions.

12. The method of claim 11, wherein at least one of:
the boron is implanted at an energy of between about 5 keV and about 20 keV,
the indium is implanted at an energy of between about 20 keV and about 100 keV, and
the boron di-fluoride is implanted at an energy of between about 20 keV and about 100 keV to form the halo regions.

13. The method of claim 12, wherein the at least one of arsenic, phosphorous and antimony are implanted at respective doses of between about $5 \times 10^{14}/cm^2$ and about $1.5 \times 10^{15}/cm^2$ to form the halo regions.

14. The method of claim 13, wherein at least one of:
the arsenic is implanted at an energy of between about 1 keV and about 4 keV,
the phosphorous is implanted at an energy of between about 1 keV and about 8 keV, and
the antimony is implanted at an energy of between about 5 keV and about 40 keV to form the halo regions.

15. A method of forming an NMOS transistor comprising:
performing an LDD implantation to establish source/drain extension regions in a substrate on either side of a gate structure formed on the substrate, wherein the LDD implantation comprises:
implanting at least one of arsenic, phosphorous and antimony: and
implanting at least one of atomic fluorine and molecular fluorine ($F_2$);
forming source/drain regions in the substrate on ether side of the gate structure, the source/drain regions being distanced from the gate structure further than from the source/drain extension regions; and
forming halo regions in the substrate on ether side of the gate structure, the source/drain regions being distanced from the gate structure further than the halo regions, where the halo regions can be formed before or after the source/drain regions are formed; wherein forming the halo regions, comprises:
implanting at least one of arsenic, phosphorous and antimony; and
implanting at least one of boron, indium and/or boron di-fluoride ($BF_2$).

16. An NMOS transistor, comprising:
a gate structure formed over a semiconductor substrate;
source/drain regions formed in the substrate on either side of the gate structure comprising at least one of arsenic, phosphorous and antimony, and at least one of carbon, atomic fluorine and molecular fluorine ($F_2$);
source/drain extension regions formed on either side of the gate structure comprising at least one of arsenic, phosphorous and antimony, and at least one of carbon, atomic fluorine and molecular fluorine ($F_2$), where the source/drain regions are distanced from the gate structure further than the source/drain extension regions; and
halo regions formed in the substrate on either side of the gate structure comprising at least one of arsenic, phosphorous and antimony, and at least one of boron, indium and/or boron di-fluoride ($BF_2$).

17. The transistor of claim 16, wherein the at least one of the source/drain regions are formed with one or more doses of between about $1 \times 10^{14}/cm^2$ and about $1 \times 10^{16}/cm^2$, and the source/drain extension regions are formed with one or more doses of between about $5 \times 10^{13}/cm^2$ and about $3 \times 10^{15}/cm^2$.

18. The transistor of claim 16, wherein the halo regions are formed with one or more doses of between about $5 \times 10^{12}/cm^2$ and about $1.5 \times 10^{15}/cm^2$.

* * * * *